United States Patent [19]

Meyerson et al.

[11] Patent Number: 4,592,933
[45] Date of Patent: Jun. 3, 1986

[54] HIGH EFFICIENCY HOMOGENEOUS CHEMICAL VAPOR DEPOSITION

[75] Inventors: Bernard S. Meyerson, Yorktown Heights; Richard M. Plecenik, Wappingers Falls; Bruce A. Scott, Pleasantville, all of N.Y.

[73] Assignee: International Business Machines Corporation, Armonk, N.Y.

[21] Appl. No.: 626,504

[22] Filed: Jun. 29, 1984

[51] Int. Cl.$^4$ .................. C23C 16/00; C23C 16/30
[52] U.S. Cl. ........................... 427/255.1; 427/255.2; 427/255.3
[58] Field of Search ............. 427/255.1, 255.2, 255.3, 427/86, 93, 94, 95, 86

[56] References Cited

U.S. PATENT DOCUMENTS

| 3,506,556 | 4/1970 | Gillery et al. | 427/255.3 |
|---|---|---|---|
| 3,563,816 | 2/1971 | Iida et al. | 148/175 |
| 3,660,179 | 5/1972 | Desmond et al. | 427/255.1 |
| 3,862,397 | 1/1975 | Anderson et al. | 219/405 |
| 3,964,430 | 6/1976 | Purmal | 118/49 |
| 4,033,286 | 7/1977 | Chern et al. | 118/49 |
| 4,062,318 | 12/1977 | Ban et al. | 118/49 |
| 4,107,352 | 8/1978 | Hakim | 427/50 |
| 4,401,689 | 8/1983 | Ban | 427/45.1 |
| 4,436,770 | 3/1984 | Nishizawa et al. | 427/255.3 |

OTHER PUBLICATIONS

B. S. Meyerson et al, J. Appl. Phys. 54, (3). p. 1461, 3/19/83, "The Preparation of in situ Doped Hydrogenated Amorphous . . . ".
B. A. Scott et al, J. DDE, Physique, 42, C4–635 (1981) "Deposition of a-Si:H by Homogeneous CVD".
B. A. Scott et al, Appl. Phys. Lett., 39, 73 (1981) "Kinetics and Mechanism of Amorphous Hydrogenated Silicon Growth . . . ".
B. A. Scott et al, Appl. Phys. Lett., 40, 973 (1982) "Low Defect Density Amorphous Hydrogenated Silicon Prepared . . . ".
B. A. Scott et al, J. Appl. Phys. 54 (12), p. 6853, Dec. 1983, "Growth and Defect Chemistry of Amorphous Hydrogenated Silicon".
R. Bilenchi et al, J. Appl. Phys., 53, (9), p. 6479, Sep. 1982, "Hydrogenated Amorphous Silicon Growth by $CO_2$ . . . ".

Primary Examiner—Sadie L. Childs
Attorney, Agent, or Firm—Jackson E. Stanland

[57] ABSTRACT

A technique and apparatus for homogeneous chemical vapor deposition (HCVD), wherein a heated carrier gas is mixed with a source gas in a location close to a substrate on which deposition is to occur. The heated carrier gas transfers heat to the source gas in order to decompose it, producing the intermediate species necessary for deposition onto the substrate. Thus, the source gas is not subjected to heating above its pyrolysis temperature prior to being transported to the immediate vicinity of the substrate. This HCVD apparatus includes a heat source for heating the carrier gas, a tube for bringing the heated carrier gas to a location close to the substrate, and another tube for bringing the reactive source gas to the aforementioned location where it is mixed with the hot carrier gas to cause decomposition of the source gas close to the substrate. The substrate temperature is decoupled from the hot gas temperature and is significantly colder than the hot gas temperature. Simultaneous deposition onto a plurality of substrates is possible, and the system can be scaled-up to provide deposition over a large area.

12 Claims, 5 Drawing Figures

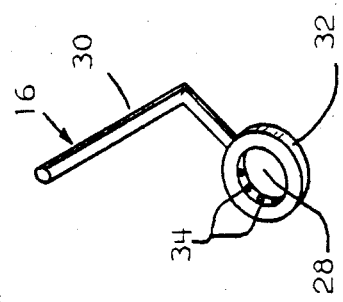
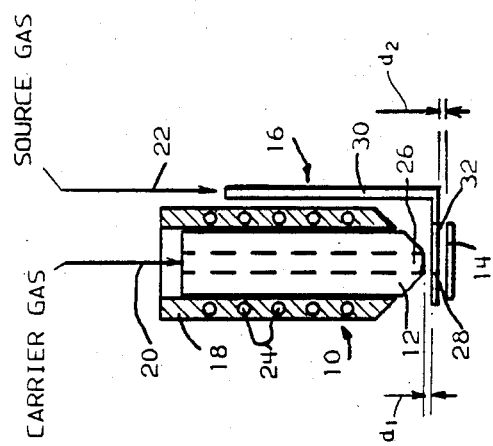

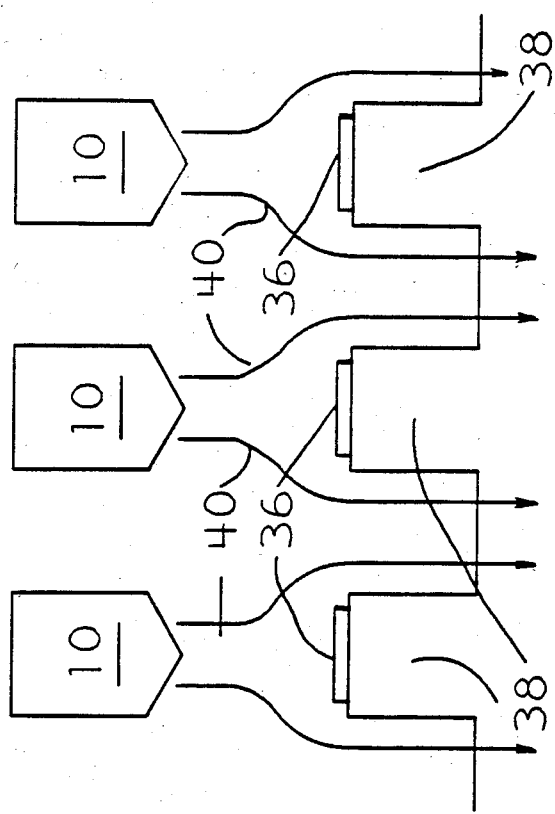

HIGH EFFICIENCY HOMOGENEOUS CHEMICAL VAPOR DEPOSITION

DESCRIPTION

FIELD OF THE INVENTION

This invention relates to homogeneous chemical vapor deposition (HCVD), and more particularly to an improved reactor and method for HCVD, in which a heated carrier gas is mixed with a source gas reactant in the vicinity of the substrate onto which felon deposition is to occur.

BACKGROUND ART

One of the techniques known in the art for depositing films of amorphous or crystalline semiconductors, as well as insulating films, is chemical vapor deposition. In this technique, deposits onto a substrate are produced by heterogeneous gas-solid or gas-liquid chemical reactions at the surface of the substrate. A volatile compound of the element or substance to be deposited is introduced into a reactor and decomposed as by thermal means, or reacted with other gases or vapors, at the surface of the substrate in order to yield non-volatile reaction products which deposit on the substrate surface. Chemical vapor deposition processes are well-known for the deposition of silicon films, and insulators of silicon.

In a particular type of chemical vapor deposition, termed homogeneous chemical vapor deposition (HCVD), a homogeneous reaction is produced by decoupling the temperature of the gas and the substrate. This contrasts with conventional CVD where both the source gases and the substrate are generally hot and are at about the same temperature. By decoupling the temperature of the source gas from the substrate, the substrate can be kept at a much lower temperature. This has advantages in many fabrication processes, and in particular in the fabrication of hydrogenated amorphous silicon.

In a conventional apparatus for HCVD, the source gas is thermally heated to its pyrolyzing temperature, as by using a hot-wall reactor, and is pumped to the vicinity of the substrate or carried thereto by a carrier gas. HCVD relies on the gas phase (homogeneous) decomposition of the source molecules, rather than on surface (heterogenous) decomposition as in standard CVD techniques.

As an example of HCVD, films of silicon can be deposited on a substrate using a source gas such as silane. The silane will be homogeneously decomposed at a high temperature and a low pressure, with a film of silicon being deposited upon the low temperature substrate. The silane is drawn through a furnace-heated reactor containing a pedestal on which the substrate is located. The pedestal is cooled, as by nitrogen flow, to maintain its temperature separate and below that of the gases in the reactor. When the source gas is heated to its pyrolysis temperature, an adequate deposition rate onto the substrate is obtained from the homogeneous decomposition reaction by operating just below the gas phase nucleation threshold. HCVD is described in more detail in the following references:

B. A. Scott et al APPL. PHYS. LETT., 39, 73 (1981)

B. A. Scott et al APPL. PHYS. LETT., 40, 973 (1982)

B. A. Scott et al J. DE PHYSIQUE 42, C4-635 (1981)

B. A. Meyerson et al J. OF APPL.PHYS., 54, 1461, March 1983).

Although HCVD is an advantageous process which can be used at low pressures and low temperatures to produce good quality films, this process is not without problems. For example, the major problems associated with HCVD have been the following:

1. low deposition rate,
2. homogeneous nucleation of particulates, and
3. a large depletion of the source gas on the hot reactor walls without the deposition of useful product.

It has been found that conventional HCVD hot-wall reactors do not localize decomposition of the reactants in the vicinity of the substrate, and do not provide steep thermal gradients between the gas phase (hot) reactants and the solid surface (cold) upon which the film is to be grown. If this gradient is not as steep as possible, clusters of particulates will form in the hot gas which either deposit on the walls of the reactor or are swept away as unreacted molecules. This in turn depletes the available supply of film precursor. The extended hotwall reactors also increase the liklihood of gas phase nucleation of particulates. The chemistry of the reactions which occur during the preparation of, for example, amorphous silicon by HCVD are described by B. A. Scott et al, J. APPL. PHYS. 54 (12), page 6853, December 1983 (see paragraph A, page 6855).

A technique for heating reactive source gases in CVD other than by a so-called "hot wall" reactor (which is a furnace generally providing heat along the outside wall of a chamber in which the source gas travels) is the type of CVD termed laser-induced CVD. This technique is described in more detail by R. Bilenchi et al, J. APPL. PHYS. hpl.53, p. 6379, September 1982. In this technique laser light, such as that produced by a $CO_2$ laser, is directed into a gas in order to heat it so that it will decompose. However, this technique is difficult to scale-up, and often provides an uneven temperature distribution.

In laser-induced CVD, the wavelength of the light has to be matched to a vibrational mode in the gas in order to transfer energy to the gas. This often requires that an additional gas be added to the source gases. For example, $SiH_4$ (silane) does not absorb $CO_2$ laser light so in order to absorb the laser light $SiF_4$ is added. The $SiF_4$ absorbs the light, and then transfers heat to the silane. Energy is distributed through the vibrational modes of the $SiF_4$ in a manner in which relaxation will not occur rapidly so that heat can be transferred to the silane for decomposing it. It is also desirable that the additive (such as $SiF_4$) not decompose to contaminate the decomposition products which are to deposit onto the substrate. Since an additive gas with many vibrational modes is required, the choice of the additive is severely limited. For example, more inert gases such as He, Ne, and Ar cannot be efficiently heated with laser light. These inert gases are preferable to use because they will not decompose to adversely participate in the reaction causing the deposited film. Gases such as nitrogen and hydrogen are also poor additives, since they only have one vibrational degree of freedom and relax very readily to a ground energy state. This means that heat will not be efficiently transferred from the hydrogen or nitrogen to the source gas to be decomposed.

In the choice of the additive to be used to absorb laser light, it is also necessary that the additive gas not have a radiational mode, since the energy pumped in by the laser light would then be lost as reradiated light. Accordingly, it is a primary object of the present invention to provide improved reactor design concepts to eliminate the aforementioned problems and to further enhance the generality of HCVD in preparing both amorphous and crystalline forms of insulating and electronic materials.

It is another object of this invention to provide enhanced deposition rates in HCVD.

It is another object of this invention to provide improved HCVD in which homogenous nucleation of particulates is minimized.

It is another object of this invention to provide improved HCVD in which source gas depletion in the reactor is minimized.

It is another object of this invention to provide improved HCVD in which deposition of film precursors onto reactor walls is minimized.

It is a further object of this invention to provide an improved apparatus and method for HCVD for the deposition of amorphous and crystalline films.

It is a still further object of this invention to provide an improved reactor design and technique for HCVD in which a steep thermal gradient is provided between the hot gas phase reactants and the cold substrate onto which deposition is to occur.

It is a still further object of this invention to provide an improved technique and apparatus for HCVD which is suitable for the deposition of thin films over large areas.

It is another object of this invention to provide improved HCVD techniques for processing multiple wafers in which deposition can occur onto a plurality of substrates.

It is another object of this invention to provide enhanced HCVD having an increased range of pressures which can be utilized during deposition.

It is another object of this invention to provide improved HCVD wherein the decomposition of reactants providing the film constituents occurs close to the substrate.

It is another object of this invention to provide improved HCVD which is suitable for the deposition of both insulating and semiconducting films.

It is a further object of this invention to provide improved HCVD for the deposition of both doped silicon films and insulating films of silicon.

In addition to the problems described above with respect to uneven heat distribution, limited availability of additive gases, and the difficulty of scale-up, lasers thamselves are very inefficient light sources (approximately 10%). Thus, while laser-induced CVD is a "cold-wall" approach, it is not without problems.

Accordingly, it is another object of this invention to provide a technique for HCVD which provides an improved cold-wall reactor design.

It is another object of this invention to utilize simple and reliable components for providing a cold-wall reactor.

It is another object of this invention to provide a technique and apparatus and HCVD in which inert gases can be used to provide heat for transfer to source gases.

It is another object of this invention to provide an apparatus and techniques for HCVD wherein uniform heat distribution is obtained through the simple expedient of passing a carrier gas through a hot pipe prior to the transfer of heat from the heated carrier gas to a source gas which is to be decomposed for deposition onto a substrate.

DISCLOSURE OF INVENTION

This invention describes a method and a reactor for HCVD which eliminates the aforementioned problems of gas precursor depletion etc., and provides a very steep temperature gradient from the hot gas phase to the cold substrate. This improved reactor design is suitable for large scale use in the deposition of all types of films, including both semiconducting and insulating films.

The invention minimizes the influence of hot walls on the gas phase reactants whose constituents form the deposited film. The technique of this invention is to heat a carrier gas, such as an inert gas, and to transport the heated carrier gas to the vicinity of the substrate onto which deposition is to occur. The cold source gas which is to be decomposed to provide the constituents forming the deposited film is also brought to the vicinity of the substrate where the cold source gas will mix with the heated carrier gas. This intermixing transfers heat to the source gas at or near the substrate surface, which then decomposes and subsequently deposits on the substrate to form the deposited film. In this manner, the source gases are not heated prior to their decomposition, and the decomposition occurs close to the substrate. Further, a very steep thermal gradient is provided between the hot gas phase and the cold substrate in order to reduce the liklihood of gas phase nucleation of particulates from the source gas. The deposition rate is increased and nucleation of particulates in the gas phase is also reduced. These advantages occur while at the same time maintaining independent thermal control of both the gas phase chemistry and the substrate surface chemistry.

A reactor design for achieving this improved HCVD utilizes means for heating the carrier gas, means for transporting it to a location close to the substrate, and means for transporting the source gas to that location where it can be intermixed with the heated carrier gas in order to transfer heat for decomposing the source gases. This reactor can be scaled for the deposition of a film onto a plurality of substrates.

In practice, the source gases can be any gases capable of thermal decomposition in order to yield the constituents required in the deposited film. The carrier gas is generally a gas which does not decompose in order to prevent contamination of the deposited film. Inert gases such as He, Ar, etc., are very suitable. However, while the carrier gas preferably does not decompose and participate in the reaction forming the deposited film, it is within the practice of this invention to also use heated carrier gases which are themselves the source of a deposited film constituent. For example, deposited films of $SiO_2$ can be formed using a source gas comprising silane ($SiH_4$) while the carrier gas could be an oxidant such as $NO_2$. Thus the carrier gas would in this case supply the oxygen necessary for the deposition of $SiO_2$ films.

The specific dimensions of the reactor are scaled to optimize heat transfer from the carrier gas to the reactive source gas, so that a high concentration of film-forming precursors exists adjacent to the substrate surface in the desired steep thermal gradient. In addition to the independent thermal control of the gas phase surface chemistry in this reactor, the conditions over which HCVD may be carried out can be generalized to a much wider range of pressures (0.001 to above 1.0

Torr) than is generally available in prior art "hot wall" reactors.

These and other objects, features and advantages will be apparent from the following more particular description of the preferred embodiments.

BRIEF DESCRIPTION OF THE DRAWINGS

FIG. 1 schematically illustrates an apparatus which can be used to mix a hot carrier gas with a source gas prior to deposition onto a substrate.

FIG. 2 is an enlarged view showing a portion of the apparatus of FIG. 1.

FIG. 3 is a schematic illustration of how a plurality of reactor nozzles of the type shown in FIG. 1 can be used to provide deposition onto a plurality of substrates.

BEST MODE FOR CARRYING OUT THE INVENTION

Figure 4:
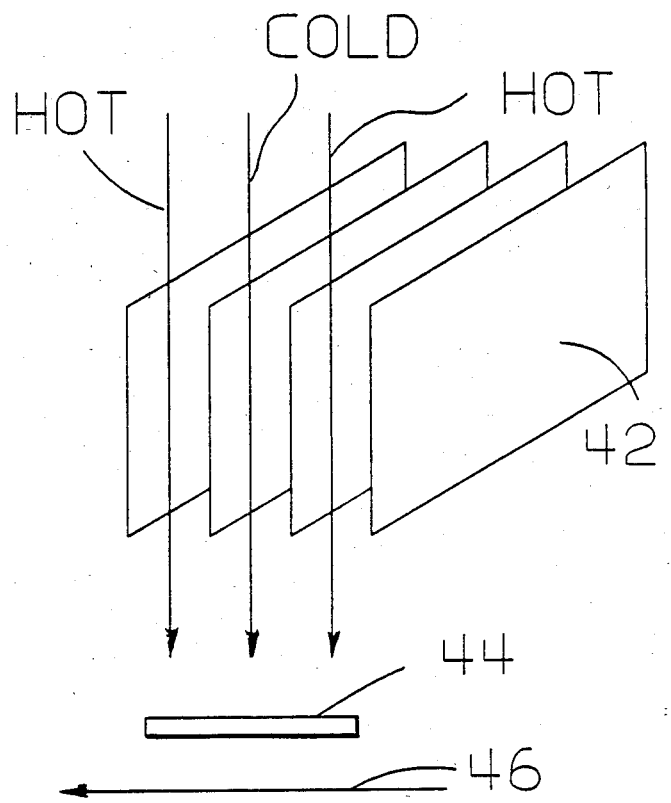
FIG. 4 is a schematic illustration of a technique for separating and later mixing a hot carrier gas and a cold source gas in the vicinity of a moving substrate.

In the practice of this invention, the effects of a hot-wall reactor are minimized by thermally isolating the heated carrier gas from the source gas to be decomposed, until these two gases are brought to a location close to the substrate. At that location, heat is transferred from the heated carrier gas to the cold source gas in order to decompose the source gas. In turn, this provides the constituents which deposit on the substrate to form the desired film. Independent thermal control for the hot gas phase and the cold substrate are provided in order to achieve the advantages of HCVD. The source gases (which can include a dopant-supplying gas) are picked in accordance with the characteristics desired for the deposited film, while the carrier gases are picked in a manner to avoid adverse reactions which would contaminate the deposited film, and/or to provide another constituent of the deposited film. In this manner, inert gases can be used as the carrier gases to avoid many of the problems associated with the prior art. The source gas can also be diluted with an inert "carrier" gas (for example, 10% silane in helium can serve as the "source" gas). A dopant source, such as phosphine ($PH_3$), diborane ($B_2H_6$), or Arsine ($A_sH_3$) can also be present in the source gas stream.

The exact means by which the carrier gas is heated before contact with the source gas can be varied, but it is generally more simple and economical to pass the carrier gas through a heated pipe in order to uniformly heat it to a desired temperature. The designs shown in the drawing achieve these general purposes.

Referring in more detail to FIG. 1, a reactor nozzle design 10 includes a first means 12 (such as a tube) for transporting the carrier gas to the vicinity of the substrate 14, and a second tube 16 used to transport the source gas to a location close to the substrate 14 where it can be intermixed with the heated carrier gas. A heating means 18, such as a furnace, is used to heat the carrier gas in the enclosed tube 12. The carrier gas is transported along tube 12 in the direction of arrow 20, while the source gas is transported along tube 16 in the direction of arrow 22 using standard techniques, such as pumps well known in all types of CVD and HCVD apparatus.

The materials comprising the different components of FIG. 1 are well known in the art. For example, tubes 12 and 16 can be comprised of stainless steel or quartz while furance 18 is comprised of a high heat conductivity material such as a metal, having embedded cartridge heaters 24 therein. Generally, the apparatus shown in FIG. 1 is located within a larger enclosing reactor tube which is not shown in this drawing for ease of illustration. However, such reactor tubes are well known in the art and are of the type to be described later with respect to FIG. 5.

In the deposition of a film onto a substrate 14, the heated carrier gas exits tube 12 from the nozzle opening 26 and enters an opening 28 in tube 16 where it is brought into contact with the source gas. This operation can be understood more fully by referring to FIG. 2, which shows the source gas transport means 16 more clearly. This transport means is comprised of a tube portion 30 and an annular ring 32 having the opening 28 therein. Annular ring 32 is hollow to allow the source gas to flow around the periphery of ring 32. A plurality of small openings 34 is located on the inner wall of ring 32, through which the source gas passes into the space 28 where it begins intermixing with the heated carrier gas. The mixture of heated carrier gas and source gas then moves to the vicinity of the substrate 14, where decomposition of the source gas occurs to provide the constituents which deposit upon the substrate 14 to produce the desired film.

The distance $d_1$ between the nozzle opening 26 and the annular ring 32, as well as the distance $d_2$ between the annular ring 32 and the substrate 14, can be varied in accordance with the thermal properties and desired chemistry that is to occur between the hot carrier gas and the source gas. These distances depend on the nature of the carrier gas and the source gas, and on how fast the system will come to thermal equilibrium relative to the desired gas phase chemistry and substrate surface chemistry. As an example, the carrier gas is heated to a temperature which will provide sufficient heating to decompose the source gas, which can be at room temperature or biased to a temperature in excess of room temperature. The hot carrier gas and the source gas generally mix within a few mean free paths and the amount of mixing will also depend upon the flow rate of the gases and the heat capacity of these gases. Generally, these distances range from approximately 0.1 mm to several centimeters. Further examples will be given later.

FIG. 3 schematically shows a deposition system in which a plurality of nozzles 10 of the type shown in FIG. 1 are used to provide film deposition onto a plurality of substrates 36. These substrates are located on the substrate holder 38. Each of the injectors 10 provides decomposed source gas to the substrates 36, where the mixture of heated carrier gas and decomposed source gas is indicated by the arrows 40. Thus, a combination of the reactor nozzles 10 can be combined in a single HCVD system to provide deposition onto numerous substrates at the same time.

FIG. 4 illustrates schematically another approach for providing the hot carrier gas and cold source gas to a substrate. Here, a plurality of baffles 42 is used to separate the flow of hot carrier gas and cold source gas.

These gases can be provided by tubes of the type shown in FIG. 1. The baffles 42 do not allow substantial mixing of the carrier gas and the source gas until they reach an area close to the substrate 44. In this illustration, the substrate moves past the baffles 42 in the direction indicated by the arrow 46. Such a system would be used in an apparatus where a plurality of wafers is conveyed past an area where the source gas is heated by intermixing with the hot carrier gas.

Figure 5:
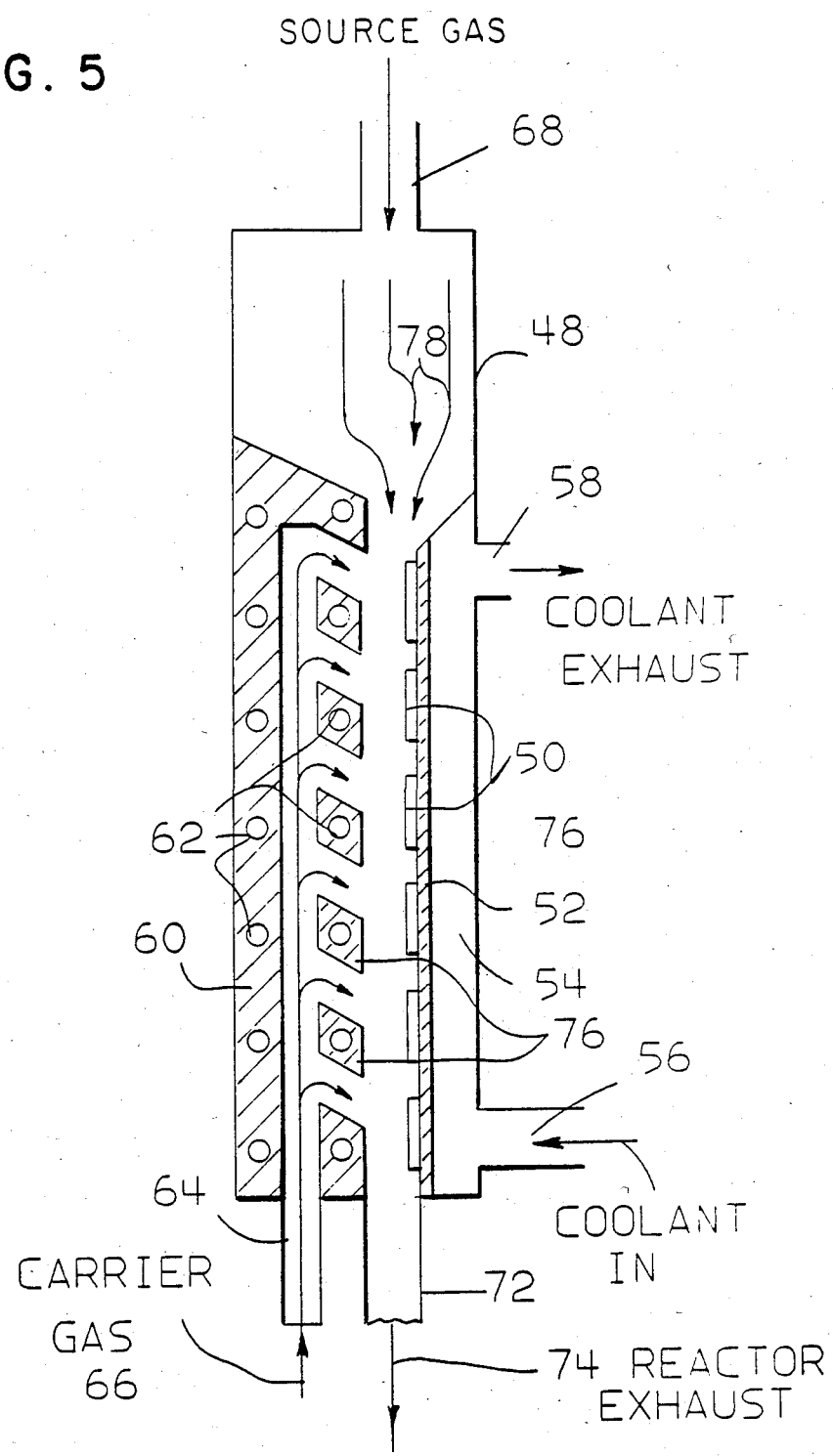
FIG. 5 is a schematic illustration of an apparatus for providing HCVD onto a plurality of substrates, using a type of baffle-deflection technique such as that generally illustrated in FIG. 4.

FIG. 5 illustrates a more complete structure suitable for HCVD onto a plurality of substrates using the concept of the present invention. The apparatus is comprised of a reactor tube 48, which could be, for example, quartz. A plurality of substrates 50 are located on a plate 52 having high thermal conductivity (such as a metal) which in turn is located on a cooled substrate holder 54. An input port 56 is provided for the flow of coolant into holder 54, while an outlet port 58 is provided for the coolant exhaust. A heated manifold 60 is located in the reaction tube 48, into which are located embedded cartridge heaters 62. Manifold 60 is comprised of a material having high thermal conductivity, such as a metal. Cartridge heaters 62 are used to heat the carrier gas which flows into the manifold 60 via input port 64. The flow of carrier gas into manifold 60 is indicated by the arrow 66. Another input port 68 is provided in the top of reaction tube 48 for entry of the source gas, or reactant gas, as indicated by the arrow 70. The exhause products of the reactor are removed from tube 48 via the output port 72, as indicated by the arrow 74.

Portions 76 of the heated manifold 60 are used to deflect the flow of the heated carrier gas to a location close to each substrate 50. The curved arrows 78 indicate the flow of the source gas in tube 48 in a direction bringing the source gas into close proximity to the substrates 50. Intermixing of the hot carrier gas and the cold source gas close to each of the substrates causes a transfer of heat to the source gas and subsequent decomposition of the source gas. This provides intermediate reaction products and deposition of the desired film constituents on each of the substrates 50. The chemistry of the decomposition reaction depends upon the type of film to be deposited, and is generally known for HCVD systems. For example, the chemistry involved in the deposition of amorphous hydrogenated silicon by HCVD is described in the aforementioned technical article by B. A. Scott et al which appeared on page 6853 of J. APPL. PHYS., 54 (12), December 1983. The apparatus of FIG. 5 provides independent control of the gas phase chemistry and the substrate surface chemistry. The source gas can be pre-heated to a particular temperature or brought into the reaction tube 48 at room temperature. The function of the carrier gas is to provide heat to the source gas to decompose it in a region very close to the substrates 50. In this manner, a very steep thermal gradient is provided between the hot gases and the cold substrate (which is generally several hundred degrees C colder than the hot gases) in order to avoid the problems encountered in prior HCVD systems.

For ease of illustration, the usual pumps, valves, and other equipment typically used in HCVD systems are not shown in FIG. 5. One of skill in the art would be aware of the various components used in HCVD processing.

As noted previously, the carrier gas has as its main function the transfer of heat to the source gas and for this reason can be an inert gas which does not decompose or adversely participate in the reaction to decompose the source gas. This provides an extra clean system and eliminates the formation of particulates in the reactor and the contamination of the deposited film. In the practice of this invention, the hot carrier gas can provide all of the thermal energy necessary for the decomposition of the source gas, or the source gas can be thermally biased to a temperature less than its decomposition temperature prior to entry into the reactor 48. Still further, this type of apparatus provides an easy way to uniformly heat the carrier gas to a desired temperature.

EXAMPLES

In the injector 10 shown in FIG. 1, the reactive source gas (pure, or mixed with diluent) is injected into the hot flowing carrier gas stream, and the two mix by both diffusion and convection. Full mixing will occur within approximately 0.12 cm or more below the source ring 32, depending upon gas pressure. If the reactor is used to deposit silicon from a gas such as silane, for example, the silane ($SiH_4$) partial pressure should be less than the homogeneous nucleation threshold. Values of this parameter can be found in the literature, for example, in Eversteijn, Phillips Research Reports 26, 134 (1971). For most common operating ranges, e.g., inert (carrier) gas pressures are 1–760 Torr, and growth temperatures $T_g$ are between 500° C. and 1200° C. The reactive source gas is injected at pressures from $10^{-4}-10$ Torr (or more) and at room temperature. Of course, the source gas can be biased to a temperature just below its pyrolysis temperature and then decomposed when it is intermixed with the heated carrier gas. In this case, the carrier gas would not have to be heated to such a high temperature.

In FIG. 1, the nozzle opening 26 has an inside diameter of approximately 1 mm. The source ring 32 has an inside diameter of approximately 1mm or greater, while the outside diameter of the source ring 32 is not critical. If more than one injector 10 is used, as illustrated in FIG. 3, this will dictate the outside diameter of the injector.

The distance $d_2$ from the source gases to the substrate can generally be between 0.5 and 10 cms. These values are dictated by the number of injectors used in the HCVD system (which is a function of the area to be covered) and by thermal equilibrium distances. Such distances are well known in the art and reference is made to S. W. Benson, Foundations of Chemical Kinetics, McGraw-Hill, New York (1960). In a typical condition, the injectors 10 would be separated by approximately 2 cms and the source ring-to-subtrate distance $d_2$ would be approximately 2 cms.

Some typical operating conditions for HCVD in accordance with the present process using any of the structures shown would be the following:

Inert carrier gas—helium
Carrier gas temperature—850° C.
Carrier gas partial pressure in the reactor—10 Torr
Reactive source gas—silane
Source gas partial pressure in the reactor—100 millitorr
Source gas temperature-room temperature
Partial pressures are achieved by regulating the flow of source and carrier gasses.

As mentioned previously, the carrier gas can be any gas and is preferably an inert gas which does not decompose and produce contaminants in the gas stream delivered to the substrate. Suitable inert gases include He, N, H and Ar. Under certain conditions $SiF_6$, and $SiF_4$ can be used. For the deposition of silicon films, silicon containing gases such as $SiCl_4$, $SiCl_2H_2$, $Si_2H_6$, $Si_3H_8$ (and other higher order silanes) can be used for the source gas, in addition to silane.

While it is desirable to have the carrier gas be an inert gas, it is also possible for the carrier gas to carry a constituent which is necessary in the deposited film. For example, the carrier gas can also include $NH_3$ while the source gas contains Si, if it is desired to deposit a silicon nitride film. Correspondingly, oxygen can be added to the carrier gas stream if it is desired to deposit a silicon oxide or silicon dioxide film.

While silicon semiconducting films have been mentioned as suitable films for deposition by this technique, other semiconductors can be deposited provided that volatile reactive gases containing the requisite elements are used as the source gas. For example, GaAs can be deposited from Ga $(CH3)_3$ plus $AsH_3$ injection. Any film which can be prepared by present CVD techniques can be prepared by this improved HCVD technique. In addition, because of the advantages of the present technique, it may be possible to prepare high quality films of materials which have not been successfully prepared by previous CVD techniques.

This improved HCVD technique makes possible the preparation of insulating and passivating layers on substrates which are not able to tolerate conventional high temperature processing. Examples include silicon oxides and silicon nitrides of various stoichiometries which may be deposited from silane/nitrous oxide-oxygen or silane/ammonia mixtures, respectively, at temperatures as low as room temperature. Since the substrate temperature can be decoupled from the gas phase temperature, and since gas phase source decomposition is used to create the intermediate species required for film formation, the substrates do not have to be heated to dissociate the source gas.

This improved HCVD technique can also be used to produce films on materials having dissimilar expansion characteristics. An example is self-supporting membranes of silicon nitride on silicon, as are used in the preparation of x-ray lithography masks. An obstacle to the preparation of these membranes in conventional CVD processes is the need for substrate temperatures of 600°–700° C. These substrates are then cooled to room temperature. When a hole is etched in the silicon substrate from the back to create a free-standing window of silicon nitride, the nitride film cracks due to intrinsic stress induced as the sample/film sandwich is cooled down. This problem is eliminated when the deposition of nitride is on a relatively cool silicon substrate, which is possible in the HCVD technique of this invention. Additionally, it will also be possible to control stress using the present technique, in order to generate uniform curvatures of substrates.

The present technique can be used to deposit both epitaxial silicon and polycrystalline silicon. Using the reactor designs and technique of the present invention, active etchant species can be generated from a thermally excited gas source, independent of substrate temperature, and can be used to pre-clean the silicon surface while substrate temperatures will not exceed the minimum temperature required for eiptaxial growth. This eliminates the prior art need for silicon epitaxy being carried out with high temperature steps (exceeding 1100° C. These previously used high temperatures are required to remove silicon dioxide as well as other contaminants from the silicon surface prior to deposition. Using the present invention, however, allows epitaxy to be performed on a clean substrate surface at temperatures ranging from 600° C. up to approximately 1000° C.

While the invention has been described with respect to preferred embodiments thereof, it will be apparent to those of skill in the art that variations can be made therein without departing from the spirit and scope of the present invention.

Having thus described our invention, what we claim as new and desire to secure by Letters Patent is:

1. A homogeneous chemical vapor deposition (HCVD) method for depositing a film from the vapor phase onto a substrate which is at a temperature independently controllable with respect to the temperature of the vapor phase, comprising the steps of:
    heating a first gas,
    bringing said heated first gas to a location in the vicinity of a substrate onto which film deposition is to occur,
    bringing a reactive source gas to said location, said source gas being at a temperature less than its pyrolysis temperature and containing constituents to be present in said deposited film,
    intermixing said heated first gas and said source gas at said location to transfer heat from said first gas to said source gas, the amount of heat transferred being sufficient to cause decomposition of said source gas into intermediates which deposit onto said subtrate to produce said film.

2. The method of claim 1, where said first gas is comprised of a gas which does not decompose upon being heated.

3. The method of claim 1, where said first gas contains a constituent of said deposited film.

4. The method of claim 1, where said source gas contains Si.

5. The method of claim 4, where said first gas contains nitrogen.

6. The method of claim 4, where said first gas contains oxygen.

7. The method of claim 1, where said deposited film contains silicon.

8. The method of claim 1, where said first gas is transported to said location by a tube heated by a surrounding furnace.

9. The method of claim 1, where said source gas is at room temperature.

10. The method of claim 1, where said first gas contains a gas species selected from the group consisting of He, H, N, Ar, and Xe.

11. The method of claim 1, where the distance between said location and said substrate is of the order of 1 mm to 10 cms.

12. The method of claim 1, where said source gas contains a dopant.

* * * * *